(12) United States Patent
Welles, II et al.

(10) Patent No.: US 7,364,123 B2
(45) Date of Patent: Apr. 29, 2008

(54) SELF POWERED RAILWAY MONITORING SYSTEM

(75) Inventors: Kenneth Brakeley Welles, II, Scotia, NY (US); John Erik Hershey, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 262 days.

(21) Appl. No.: 11/005,344

(22) Filed: Dec. 6, 2004

(65) Prior Publication Data

US 2006/0118678 A1 Jun. 8, 2006

(51) Int. Cl.
*B61L 11/00* (2006.01)

(52) U.S. Cl. .................. 246/245; 246/270 R; 246/1 C; 246/297; 246/322; 246/473 R (58) Field of Classification Search ............ 246/169 R, 246/120, 121, 122 R, 124, 257, 260, 361, 246/270 R, 473 R, 1 C, 245, 246, 249, 292, 246/297, 313, 322; 701/19; 290/1 R
See application file for complete search history.

(56) References Cited

U.S. PATENT DOCUMENTS

| 617,246 | A | | 1/1899 | Gebhart |
| 4,004,422 | A | | 1/1977 | Le Van ............. 60/533 |
| 4,130,064 | A | * | 12/1978 | Bridwell ............. 104/154 |
| 4,173,431 | A | | 11/1979 | Smith ............. 417/229 |
| 4,211,078 | A | | 7/1980 | Bass ............. 185/27 |
| 4,238,687 | A | | 12/1980 | Martinez ............. 290/1 R |
| 5,325,700 | A | | 7/1994 | Litten ............. 73/11.06 |
| 5,397,900 | A | * | 3/1995 | Wetzler ............. 250/342 |
| 5,634,774 | A | | 6/1997 | Angel et al. ............. 417/229 |
| 6,091,159 | A | | 7/2000 | Galich ............. 290/1 R |
| 6,172,426 | B1 | | 1/2001 | Galich ............. 290/1 R |
| 6,192,804 | B1 | | 2/2001 | Snead ............. 105/274 |
| 6,204,568 | B1 | | 3/2001 | Runner ............. 290/1 R |
| 6,290,189 | B1 | * | 9/2001 | Heim ............. 246/449 |
| 6,376,925 | B1 | | 4/2002 | Galich ............. 290/1 R |
| 6,580,037 | B1 | * | 6/2003 | Luke ............. 177/25.13 |
| 6,668,216 | B2 | * | 12/2003 | Mays ............. 701/19 |
| 2004/0130158 | A1 | | 7/2004 | Kenney ............. 290/1 R |

* cited by examiner

*Primary Examiner*—Mark T. Le
(74) *Attorney, Agent, or Firm*—Fletcher Yoder (57) ABSTRACT

A data gathering apparatus comprises a power generation device configured to generate power via movement of the rail. The data gathering apparatus further comprises a sensing device configured to receive power from the power generation device and to sense at least one property of the rail, wherein the property of the rail is at least partially defined by a vehicle traveling on the rail.

6 Claims, 5 Drawing Sheets

SELF POWERED RAILWAY MONITORING SYSTEM

BACKGROUND

The present invention relates generally to railway monitoring systems and, more specifically, to systems and methods for detecting and/or monitoring various parameters related to rail operations.

Traditionally, data related to railroad traffic and railroad assets is gathered at manned junctions, such as rail yards. By way of example, rail yard workers often manually inspect railcars for damage to determine loading conditions. For instance, railcars are inspected to ensure compliance with the railroad's rules and regulations. As yet another example, rail yard workers often inspect and inventory the incoming and outgoing railcars to manage and facilitate the flow of traffic on a railroad network.

Additionally, some traditional railroad networks employ remote data gathering devices to obtain data regarding traffic between junction areas. For example, traditional remote data gathering methods and devices often employ train-based communications (e.g., radio communications from the conductor) to provide data regarding operating and traffic conditions during transit between stations. As another example, traditional remote data gathering devices and methods may employ electronic sensors that are located proximate to the rail and that are configured to automatically gather data.

Unfortunately, traditional data gathering systems and methods do not facilitate the gathering of real-time data related to the railroad assets and traffic conditions during transit between these manned junctions. For example, traditional techniques that rely on train-based communications are susceptible to human error and, often, report outdated data regarding operating and traffic conditions. Additionally, traditional remote data gathering devices require a reliable source of operating power, such as an external power grid, which can be relatively expensive to provide in remote and unpopulated areas. Thus, sensing devices are generally located close to established power grids, leaving vast areas of track unmonitored. A damaged vehicle, therefore, may cause relatively extensive damage to a rail before the damage is even detected. For instance, a flat-wheel condition on a vehicle may damage a track over hundreds a miles before it is detected, leading to maintenance costs and downtimes.

Accordingly, there is a need for improved apparatus and methods for monitoring railroad conditions and operations.

BRIEF DESCRIPTION

In accordance with one exemplary embodiment of the present technique, a data gathering apparatus that includes a power generation device configured to generate power in response to traffic on the rail is provided. The data gathering apparatus also includes a sensing device configured to receive power from the power generation device and to sense a property of the traffic traveling on the rail. Advantageously, the data gathering device facilitates the development of real-time data regarding rail conditions and traffic conditions of a railroad network. By way of example, the sensing device, when activated by the operating power from the power generation device, can sense and transmit information regarding the velocity, weight, and any number of other properties of the traffic on the rail.

In accordance with another exemplary embodiment of the present technique, a method of gathering data related to a railroad network is provided. The method includes generating power in response to traffic on the rail. The method also includes supplying the generated electric power to a sensing device, which is configured to detect at least one property of the traffic on the track.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As a preliminary matter, the definition of the term "or" for the purpose of the following discussion and the appended claims is intended to be an inclusive "or." That is, the term "or" is not intended to differentiate between two mutually exclusive alternatives. Rather, the term "or" when employed as a conjunction between two elements is defined as including one element by itself, the other element itself, and combinations and permutations of the elements. For example, a discussion or recitation employing the terminology "A" or "B" includes: "A" by itself, "B" by itself, and any combination thereof, such as "AB" and "BA." Furthermore, it is of note that the present discussion relates to exemplary embodiments, and the appended claims should not be limited to the embodiments discussed.

Figure 1:
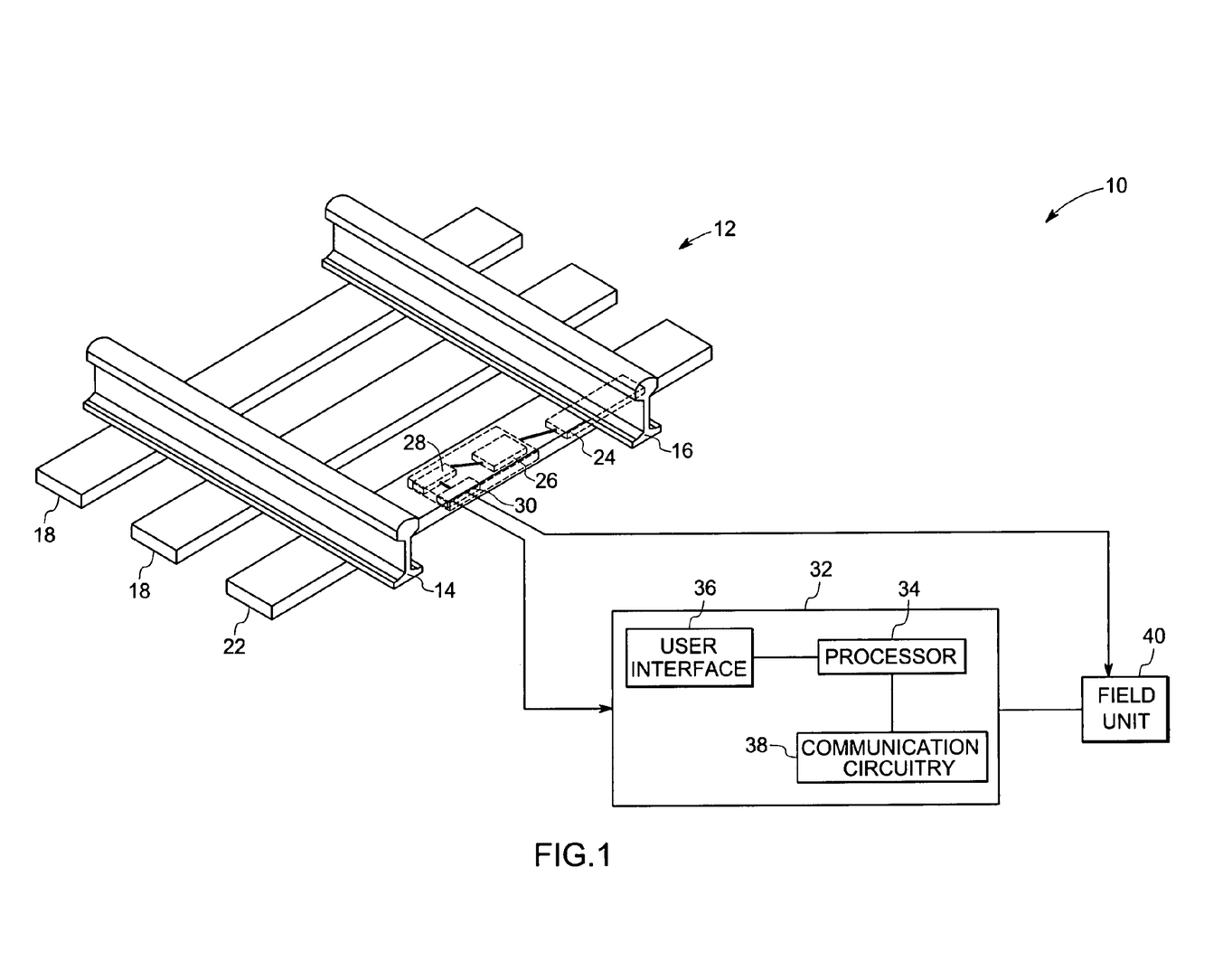
FIG. 1 is a diagrammatical representation of a railway monitoring system, in accordance with an exemplary embodiment of the present technique.

FIG. 1 illustrates an exemplary railway monitoring system 10. In the illustrated embodiment, the railway monitoring system 10 includes a railway track 12 that has a left rail 14, a right rail 16 and a plurality of ties 18, extending between and generally transverse to the rails 14, 16. The ties 18 are attached to the rails 14, 16 and provide lateral support to the rails 14, 16. The rails 14, 16 are configured to carry vehicles, such as trains, trams, testing vehicles or the like. Advantageously, the system 10 includes a power tie 22 that has hollowed regions that provide locations inside of which various components are disposed, as discussed further below. Although the illustrated embodiment shows a single power tie 22, the railroad network may include any number of power ties, and the power ties, in certain embodiments, are in electrical communication with one another. Advantageously, communication between the power ties 22 facilitates sharing of resources and facilitates the development of certain data types, such as block occupancy detection, distance to train, detection of broken rail, or the like. As discussed further below, the power tie 22 is used to power sensors, signaling devices or any number of suitable electrical devices.

The power tie 22 includes a power source, such as the illustrated power generation device 24, a sensing device 26, a processor 28, and communication circuitry 30, all of which are disposed within the hollowed regions of the power tie 22. By disposing these components in the power tie 22, the power tie 22 acts as a housing to protect and facilitate installation of the various components of the tie 22. However, in alternate embodiments, the various components can be disposed in individual housings that are independent of the power tie or ties 22. Additionally, in some embodiments, the power tie 22 includes conditioning circuitry that is configured to rectify and/or convert the power output from the power generation device 24 to a desired output power that is appropriate to the electrical components located downstream of the power generation device 24.

The sensing device 26 is coupled to the processor 28, which includes hardware circuitry and/or software that facilitates the processing of signals from the sensing device 26. As will be appreciated by those skilled in the art, the processor 28 includes a range of circuitry types, such as a microprocessor, a programmable logic controller, a logic module, etc. Additionally, those of ordinary skilled in the art will appreciate that the sensing device 26 encompasses any number of devices including weight sensors, temperature sensors, or the like.

In the railway monitoring system 10, the communication circuitry 30 is configured to receive data signals output from the processor 28 and/or the sensing device 26 and to transmit the data signals to a remote monitoring center 32. The communication circuitry 30 comprises hardware and/or software that facilitates the communication circuitry 30 to communicate the data signals to the remote monitoring center 32. In some embodiments, the communication circuitry 30 is configured to communicate the data signals to the remote monitoring center 32 in accordance with a given communication protocol, such as a cellular protocol, a wireless protocol, a radio frequency protocol, or a combination thereof. Of course, those of ordinary skilled in the art will appreciate that any number of suitable communication protocols can be employed. Additionally, the communication circuitry 30 is also configured to receive information from a remote location, such as the remote monitoring center 32. Again, the communication circuitry 30 receives data signals output from the processor 28 or the sensing device 26 and transmits these data signals to the field unit 40 via a wired connection port or a short range wireless link such as infrared protocol, Bluetooth protocol, 802.11 wireless local area network or the like.

In the illustrated railroad network, the remote monitoring center 32 includes a processor 34, user interface 36, and communication circuitry 38. Advantageously, the user interfaces facilitate inputs from a user to the data gathering device and provides a mechanics through which a user can manipulate data and sensed properties from the data gathering device. As will be appreciated by those skilled in the art, the user interface may include a command line interface, menu driven interface, and graphical user interface. To facilitate communications with field technicians, the remote monitoring center 32 and the power tie 22 are configured to communicate with a field unit 40, which, by way of example, is a laptop computer.

Figure 2:
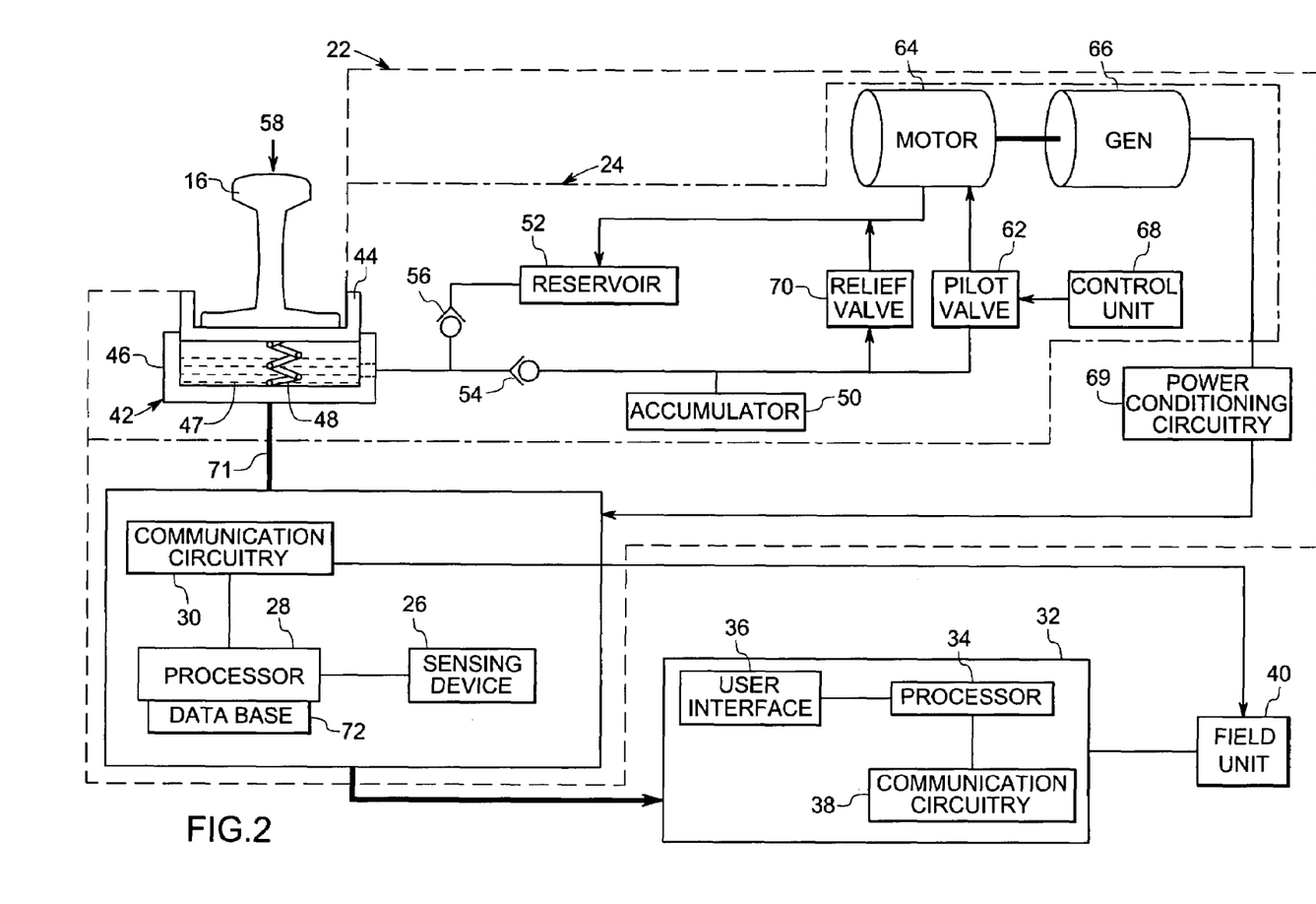
FIG. 2 is a diagrammatical representation of a railway monitoring system employing a hydraulic power scavenging unit as a power generation device, in accordance with an exemplary embodiment of the present technique.

Referring generally to FIG. 2, exemplary components of a power tie 22 are diagrammatically illustrated. As discussed above, the power tie 22 includes a power generation device 24 that is configured to convert the kinetic and potential energy of the vehicle passing on the rail into electrical energy for the system. As one example, the power generation device includes a hydraulic power scavenging unit 42. The hydraulic power-scavenging unit 42 includes a piston 44 disposed inside a cylinder 46 that is filled with a fluid 47, such as air or a suitable liquid. The piston 44 actuates downwardly (arrow 58) in response to a vehicle traveling along the railway track. That is to say, in the illustrated embodiment, the weight of a vehicle on the rail 16 downwardly drives the rail to which the piston 44 is mechanically connected. However, the piston 44 is biased towards the vehicle (i.e., upwardly) traveling along the railway track by a biasing member 48, such as a coiled compression spring. Thus, when the weight of the train is removed, for instance, the piston 44 actuates upwardly to its normal position.

In the illustrated power scavenging unit 42, the hydraulic cylinder 46 is fluidically coupled to the accumulator 50 and a fluid reservoir 52. To facilitate the unidirectional circulation of fluid, the pathway between the cylinder 46, the accumulator 50 and the reservoir 52 includes check valves 54 and 56. By way of example, the check valves are biased ball valves, which are appreciated by those of ordinary skilled in the art.

When a train passes along the railway track in proximity to the power tie 22, the weight of the vehicle drives the rails downwardly, as represented by directional arrow 58. This motion of the rail, in turn, causes the piston 44 to move downward inside the cylinder 46. As a result, hydraulic fluid 47 is forced from the hydraulic cylinder 46 to the accumulator 50. As the hydraulic fluid 47 is forced from the cylinder chamber, the fluid forces the check valve open and flows into the accumulator 50. By way of example, the hydraulic fluid 47 is stored inside the accumulator 50 at a pressure in the range of 2000 to 5000 pounds per square inch (psi).

As the vehicle passes the portion of the rail above the piston 44, the compression spring 48 biases the piston 44 upwardly and allows the flow of replenishing hydraulic fluid from the reservoir 52, thereby providing a steady state of fluid 47 to the cylinder 46. As each vehicle passes over this section of track, more and more fluid is pumped into the accumulator 50, increasing the pressure inside the accumulator 50.

When the pressure of the fluid 47 inside the accumulator 50 reaches a set pressure, a pilot valve 62 releases the pressurized hydraulic fluid from the accumulator 50, and the released fluid 47 is routed to a motor 64 and generator 66 assembly. As one example, a control unit 68 directs the pilot valve 62, which, in turn, controls the flow of the hydraulic fluid 47 from the accumulator 50. Advantageously, the illustrated scavenging system includes a relief valve 70 to release excess pressures from the accumulator 50. That is, if the pressures in the accumulator 50 exceed operating parameters, the relief valve 70 opens to release some of the hydraulic fluid 47, reducing the likelihood of damage due to over pressurizations in the system. In the illustrated system, the relief valve 70 manages a conduit that directly links the accumulator 50 and the reservoir 52, and that bypasses the motor 64 and generator 66.

When the preset limit of the pilot valve 62 is reached (i.e., the accumulator 50 has reached a certain fluid pressure), the pressurized hydraulic fluid flows from the accumulator 50 to the motor 64 and generator 66 assembly. In the illustrated system, this assembly receives the circulating hydraulic fluid, which causes at least one rotor within this assembly to rotate. The generator 66 then converts this mechanical rotation (i.e., torque) into an electrical power. By way of example, the generator 66 includes a permanent magnet rotor circumscribed by stator windings. Thus, as the permanent magnet rotor rotates, an electrical current is induced in the stator winding, and, as such, a power is produced. Of course, those of ordinary skill in the art will appreciate in light of the present discussion that any number of generator constructions are envisaged. The circulation of the fluid continues, as hydraulic fluid 47 from the motor 64 and generator 66 assembly is expelled into the reservoir 52. The power tie 22 facilitates containment of hydraulic fluid leakage. Therefore hazardous waste and environment spill concerns are mitigated.

In the illustrated embodiment, the generator 66 is coupled to the sensing device 26, the processor 28 and the communication circuitry 30, which receive operating power from the generator 66. The illustrated embodiment includes one power conditioning circuitry 69, disposed electrically between the downstream operating components (e.g., processor 28 and the generator 66). The power conditioning circuitry 69 receives input power from the generator 66 and conditions the received power to a desired output level appropriate for the various components of the system. For example, the conditioning circuitry 69 may alter the voltage of the input power and/or convert the output power between alternating current (AC) and direct current (DC) power. Advantageously, the generator 66 provides operating power to any number of components that are disposed within or external to the power tie 22 and this power may be at any number of suitable levels and types.

In the illustrated embodiment, an analog signal line 71 between the hydraulic cylinder 46 and the sensing device 26 carries an analog signal indicative of the load on the rail 16. In the illustrated embodiment, the sensing device 26 is configured to detect a property of the vehicle traveling on the rail. For instance, the sensing device 26 may receive the analog signal over the signal line 71 and from a displacement sensor coupled to the piston 44. For example, the sensing device may include a radio frequency (RF) receiver that is configured to activate and/or receive information from an RF transmitter device located on the vehicle. Thus, the sensing device 26 is configured to directly detect a property, such as cargo type, ownership, intended destination, among any number of characteristics or conditions, from the vehicle.

As another example, a property of the vehicle is determined indirectly. For instance, a property of the vehicle is sensed by the effect of the vehicle on the power generation system. In certain embodiments, the sensing device 26 is configured to sense the displacement of the cylinder, pressure increase over time in the accumulator, or changes in reservoir content over time, to name but a few parameters. Thus, based on changes in the system, the sensing circuitry senses, indirectly, a property of the vehicle traveling on the rail and also senses a property of the power generation device. Indeed, displacement of the cylinder provides an indication of the weight of the vehicle and changes in fluid pressure of the system with respect to time provide indications of the velocity of the vehicle. Various types of sensors include Hall effect sensors, resistive sensors, pressure sensors, to name but a few types of sensors.

The processor 28 includes a database 72 configured to store predefined information about vehicles traveling on the rail. For example, the database 72 includes data related to vehicle design, vehicle wheel specifications, ownership of the vehicle, intended destination of the vehicle, expected weight of the vehicle, or the like. Furthermore, the database 72 is configured to store information from the processor 28 or the sensing device, among other types of data. The database may be located locally to the data gathering device or remotely, at the remote monitoring center 32.

To communicate with the data gathering device, the remote monitoring center 32 as well as the field unit 40 include communication circuitry and user interfaces. Advantageously, the user interfaces facilitate inputs from a user to the data gathering device and provides a mechanics through which a user can manipulate data and sensed properties from the data gathering device. As will be appreciated by those skilled in the art, the user interface may include a command line interface, menu driven interface, and graphical user interface.

In another embodiment, a ratcheted vertical plunger (not shown) is attached to the power tie 22. Depressing the ratcheted plunger may cause rotation of a gear driving an electric power generator and that power can either be stored or used at the time of generation.

Figure 3:
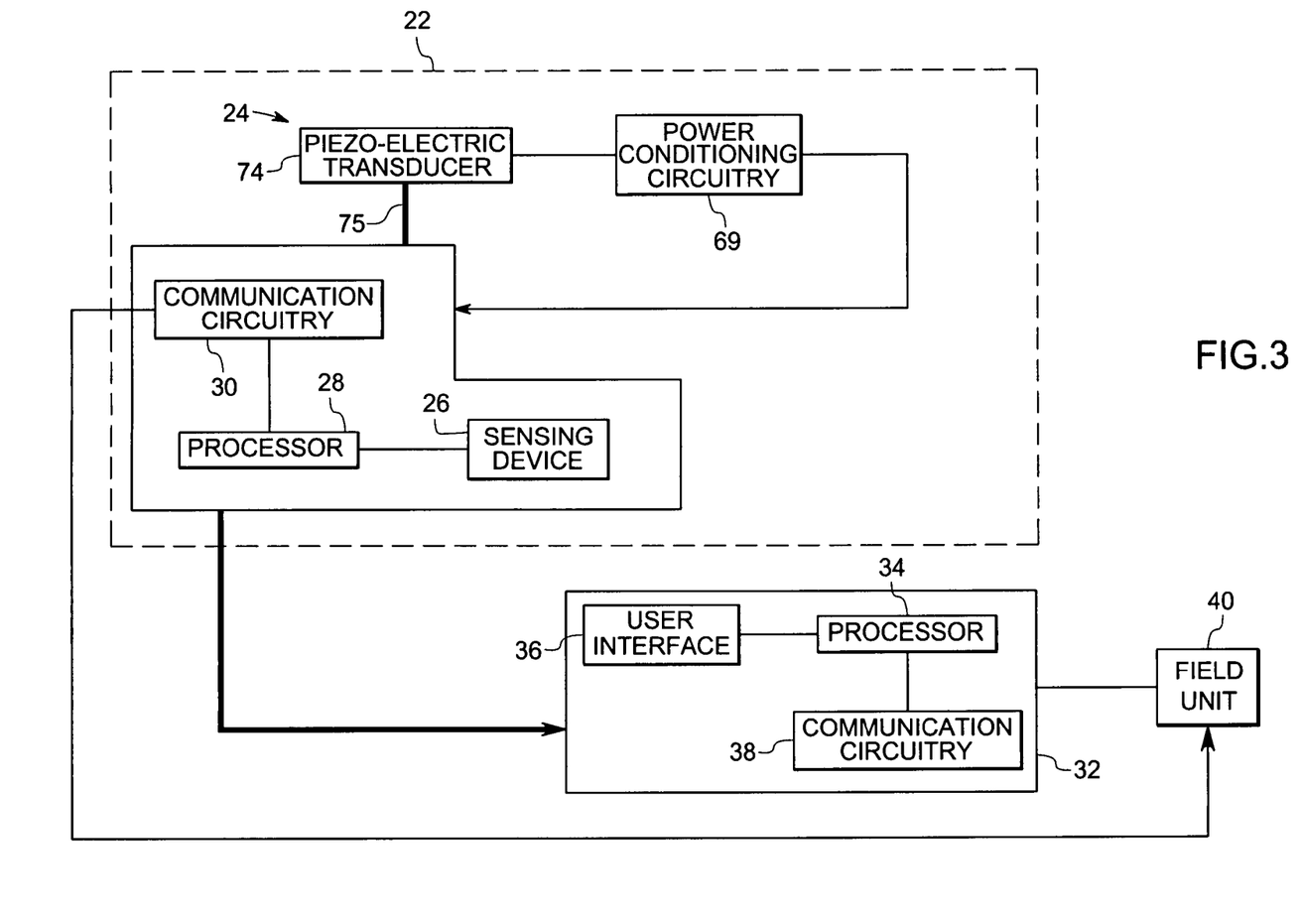
FIG. 3 is a diagrammatical representation of a railway monitoring system using a piezo-electric transducer as a power generation device, in accordance with an exemplary embodiment of the present technique.

FIG. 3 illustrates an alternative embodiment of the data gathering device. In the illustrated embodiment, the power generation device 24 comprises a piezo-electric transducer 74. The piezo-electric transducer 74 converts mechanical energy into electrical energy, as is appreciated by those of ordinary skilled in the art. For the piezo-electric transducer 74, the input excitation is a mechanical displacement of the rail (e.g., vibration, flexing) as a vehicle passes over the coupled section of rail. As is appreciated by those of ordinary skilled in the art, piezo-electric materials deform due to the application of a physical force, and the mechanical energy of this deformation is converted into electrical energy. Accordingly, the mechanical displacement of the rail caused by a passing vehicle is harnessed to physically deform the piezo-electric transducer 74, and, resultantly, electrical energy is produced in response to the passing vehicle. This resultant electrical energy is then harnessed to provide operating power to any number of components both within and external to the power tie 22.

The mechanical, electrical, physical and other properties of a particular piezo-electric transducer 74 determine the amount of electrical charge that is generated in response to a given applied force. The polarity of the generated charge on the other hand depends on whether the element is under compression or tension as a result of the externally applied force. The piezo-electric transducer 74 may be made of materials that include thin polymer films, single crystal materials, or other piezo-electric element structures. These materials are used to form structures that are easily excited from a vibration input. This input may be a single discrete frequency, a combination of frequencies, or broadband vibration with a very large number of frequencies.

In the illustrated embodiment the piezo-electric transducer 74 is coupled to the sensing device 26, the processor 28, and the communication circuitry 30, which receive operating power from the piezo-electric transducer 74. The illustrated embodiment includes the power conditioning circuitry 69 disposed electrically between the downstream operating components (e.g., processor 28 and the piezo-electric transducer 74). The power conditioning circuitry 69 receives input power from the piezo-electric transducer 74 and conditions the received power to a desired output level appropriate for the various components of the system. An analog signal line 75 between the piezo-electric transducer 74 and the sensing device 26 carries an analog signal indicative of the load on the rails.

In the illustrated embodiment, for example, a property of the vehicle is determined indirectly. For instance, a property of the vehicle is sensed by the effect of the vehicle on the piezo-electric transducer. For example, the sensing device 26, in exemplary embodiments, is configured to sense amount of charge generated by the piezo-electric transducer, amount of deformation of the transducer, or the like. Thus, based on changes in the system, the sensing device senses, indirectly, a property of the vehicle traveling on the rail and also senses a property of the power generation device. Indeed, amount of charge generated by the piezo-electric transducer 74 provides an indication of the weight of the vehicle, and amount of deformation of the system with respect to time provide indications of the velocity of the vehicle.

It is worth noting that the exemplary and above discussed power generation devices are merely examples, and these examples should not be viewed as limiting the appended claims. Indeed, a number of devices for translating the kinetic and potential (i.e., mechanical) energy of a passing vehicle into electrical energy are envisaged.

Figure 4:
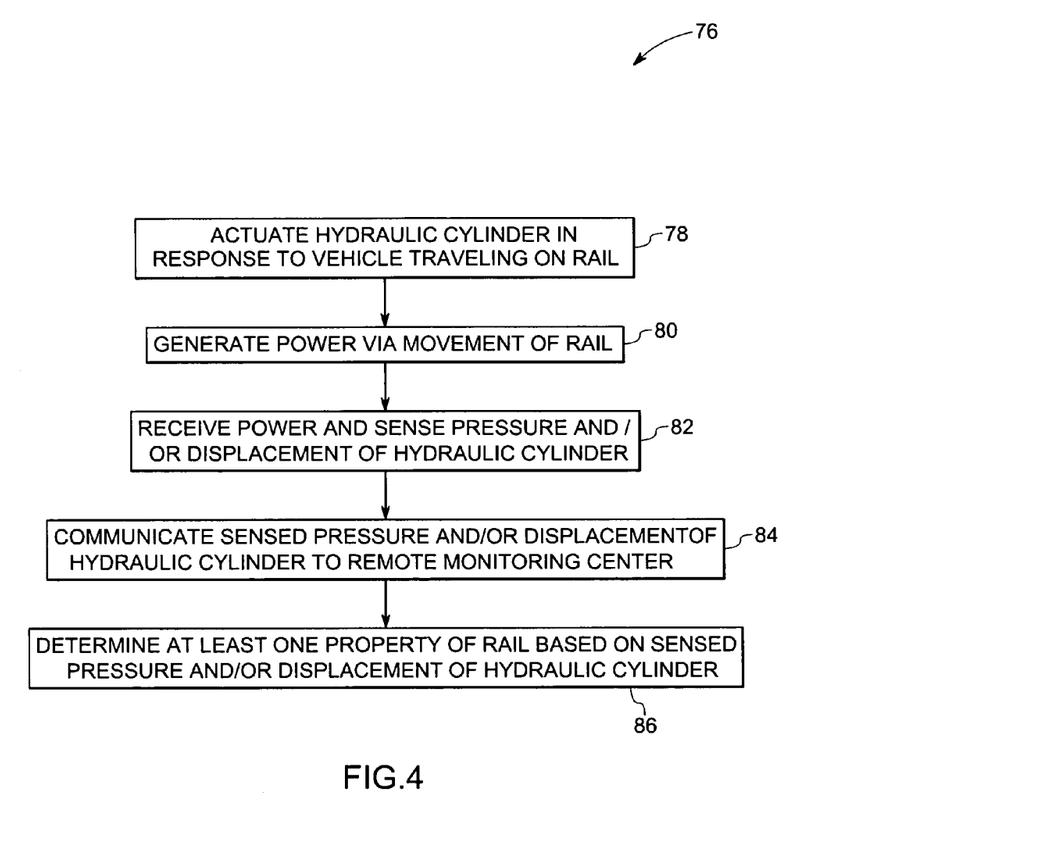
FIG. 4 is a flow chart illustrating an exemplary process of gathering data, in accordance with an exemplary embodiment of the present technique.

Referring generally to FIGS. 2 and 4, an exemplary method of gathering data is illustrated and represented generally by reference numeral 76. When a vehicle passes along the railway track, the rails and ties are driven downwardly and, as such, drive the cylinder 46 downwardly. The hydraulic cylinder 46, which is provided below the rails, is compressed, causing the piston 44 to move downward and forcing the hydraulic fluid 47, at pressure, into the accumulator 50, as represented by block 78. The pressurized fluid is utilized to drive the hydraulic motor 64. The motor 64 drives a generator 66 to produce electricity, as represented by block 80.

The sensing device 26 receives power from the generator 66 and detects a property of the hydraulic cylinder 46 as illustrated by block 82. In the illustrated embodiment, the property is the pressure and/or displacement of the hydraulic cylinder 46. A processor 28 receives signals from the sensing device 26 and determines the sensed property of the hydraulic cylinder 46. Once received, the communication circuitry 30 communicates the sensed property to a remote monitoring center 32, as represented by block 84.

In the illustrated embodiment, the processor 34, in cooperation with the communication circuitry 38 in the remote monitoring center 32, receives signals output from the above mentioned communication circuitry 30 of the sensing device 26 and determines at least one property of the vehicle based on the pressure and/or displacement of the hydraulic cylinder 46, as represented by block 86. In one example, the weight of the vehicle is measured by detecting pressure and/or displacement of the hydraulic cylinder 46. As the weight of the vehicle increases, the pressure and/or displacement of the hydraulic cylinder 46 also increases. Contrastingly, as the weight of the vehicle decreases, the pressure and/or displacement of the hydraulic cylinder 46 decreases. In another example, speed of the vehicle is determined based on the detected pressure and/or displacement of the hydraulic cylinder 46. As the speed of the vehicle increases, the pressure and/or displacement of the hydraulic cylinder 46 also increases and vice versa. In yet another example, the number of cars of the vehicle is determined based on the number of displacements of the piston 44 inside the hydraulic cylinder 46. As the number of cars of the vehicle increases, the number of displacements of the piston 44 also increases and vice versa. Similarly all the above-mentioned properties of the rails may be determined based on the pressure and/or displacement of the hydraulic cylinder 46. Indeed, the property of the vehicle may also be determined in cooperation with information stored in the database 72. For instance, the time between subsequent compression along with the wheelbase of the vehicle provide information from which the velocity of the train can be calculated. As yet another example, if the time of compression of the cylinder exceeds an expected value, which is stored in the database 72, then the processing circuitry may determine that a flat-wheel condition is possible. Of course, examples are not all inclusive, and any number of properties can be determined employing any number of sensed factors and predetermined information.

Figure 5:
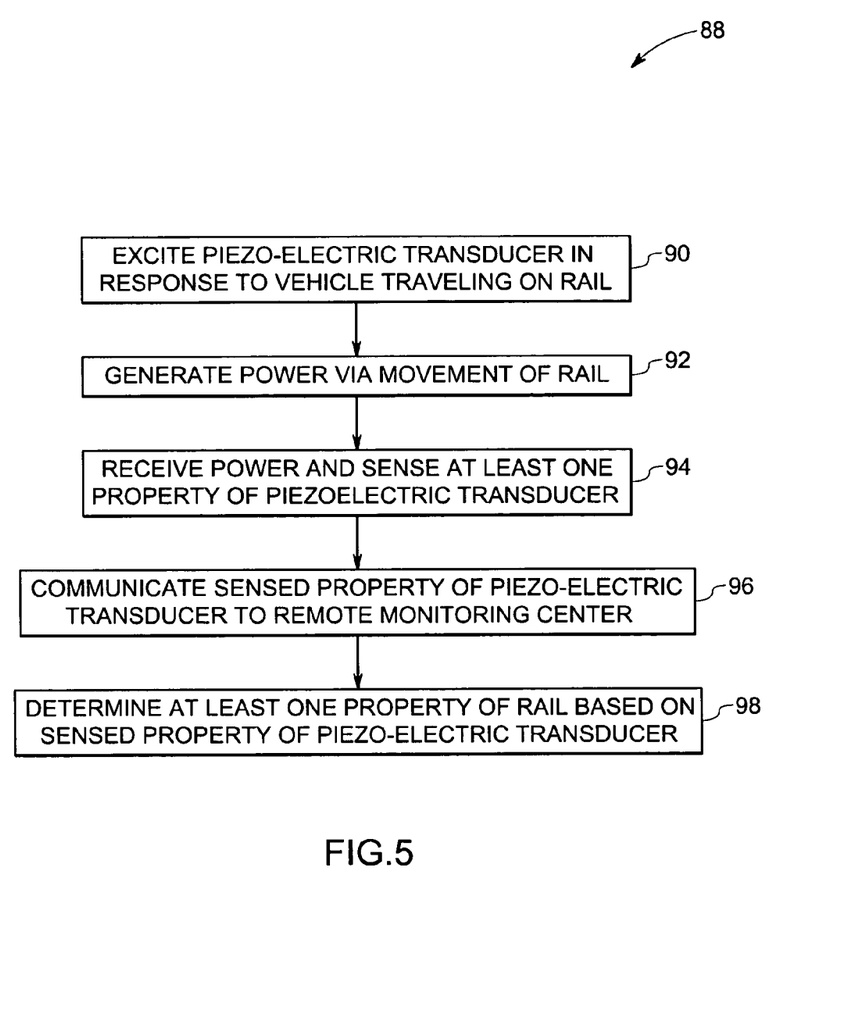
FIG. 5 is a flow chart illustrating an exemplary process of gathering data, in accordance with the embodiment of FIG. 3.

Referring generally to FIGS. 3 and 5, an exemplary method of gathering data is illustrated and represented generally by reference numeral 88. When a vehicle passes along the railway track, the rails and ties are driven downwardly and, as such, piezo-electric material deform due to the application of a physical force as represented by block 90. As a result the mechanical energy of this deformation is converted into electrical energy due to movement of rail as represented by block 92.

The sensing device 26 receives power from the piezo-electric material and detects a property of the piezo-electric material as illustrated by block 94. In the illustrated embodiment, the property is the amount of charge generated and/or deformation of the piezo-electric transducer 74. A processor 28 receives signals from the sensing device 26 and determines the sensed predetermined property of the piezo-electric material. Once received, the communication circuitry 30 communicates the sensed property to a remote monitoring center 32, as represented by block 96.

In the illustrated embodiment, the processor 34 in cooperation with the communication circuitry 38 in the remote monitoring center 32, receives signals output from the above mentioned communication circuitry 30 of the sensing device 26 and determines at least one property of the vehicle based on the amount of charge generated and/or deformation of the piezo-electric transducer 74, as represented by block 98. In one example, the weight of the vehicle is measured by detecting amount of charge generated and/or deformation of the piezo-electric transducer 74. As the weight of the vehicle increases, the amount of charge generated and/or deformation of the piezo-electric transducer 74 also increases. Contrastingly, as the weight of the vehicle decreases, the amount of charge and/or deformation of the piezo-electric transducer 74 decreases. In another example, speed of the vehicle is determined based on the detected amount of charge generated and/or deformation of the piezo-electric transducer 74. As the speed of the vehicle increases, the amount of charge and/or deformation of the piezo-electric transducer 74 increases and vice versa. In yet another example, the number of cars of the vehicle is determined based on the number of deformations of the piezo-electric material. As the number of cars of the vehicle increases, the number of deformations of the piezo-electric transducer increases and vice versa. Similarly all the above-mentioned properties of the rails may be determined based on the amount of charge generated and/or deformations of the piezo-electric material. Indeed, the property of the vehicle may also be determined in cooperation with information stored in the database 72. For instance, the time between subsequent deformations along with the wheelbase of the vehicle provide information from which the velocity of the train can be calculated. As yet another example, if the time of deformation of the piezo-electric material exceeds an expected value, which is stored in the database 72, then the processing circuitry may determine that a flat-wheel condition is possible. Of course, examples are not all inclusive, and that any number of properties can be determined employing any number of sensed factors and predetermined information.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A data gathering apparatus for use with a railroad network having a rail, comprising:
   a pair of rails;
   a power generation device coupled to the rail and configured to generate power in response to a vehicle traveling on the pair of rails;
   a sensing device configured to sense a parameter of the power generation device, wherein the parameter is at least partially defined by the vehicle traveling on the pair of rails;
   communication circuitry configured to transmit the sensed parameter in accordance with a communication protocol and to receive power from the power generation device;
   a processor device configured to determine a parameter of the vehicle based on the sensed parameter of the power generation device; and
   a database configured to correlate the sensed parameter of the power generation device to a known parameter of the vehicle.

2. The data gathering apparatus as recited in claim 1, wherein the processor device is located remotely with respect to the sensing device of the power generation device.

3. The data gathering apparatus as recited in claim 1, wherein the communication protocol comprises a radio frequency (RF) protocol.

4. A railroad network, comprising
   a pair of rails;
   a power generation device coupled to the rail and configured to generate power in response to a vehicle traveling on the pair of rails;
   a sensing device configured to sense a property of the power generation device, wherein the property is at least partially defined by the vehicle traveling on the pair of rails;
   communication circuitry configured to transmit the sensed property in accordance with a communication protocol;
   a processor device configured to determine a property of the vehicle based on the sensed property of the power generation device; and
   a database configured to correlate the sensed property of the power generation device to a known property of the vehicle.

5. The railroad network as recited in claim 4, wherein the processor is located remotely with respect to the sensing device of the power generation device.

6. The railroad network as recited in claim 4, wherein the communication protocol comprises a radio frequency (RF) protocol.

* * * * *